United States Patent
Katayama

(10) Patent No.: US 10,404,257 B2
(45) Date of Patent: Sep. 3, 2019

(54) INFORMATION PROCESSING APPARATUS, INFORMATION PROCESSING METHOD, AND COMPUTER-READABLE MEDIUM STORING INFORMATION PROCESSING PROGRAM

(71) Applicant: FUJITSU LIMITED, Kawasaki-shi, Kanagawa (JP)

(72) Inventor: Kentaro Katayama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/019,884

(22) Filed: Jun. 27, 2018

(65) Prior Publication Data
US 2019/0013812 A1    Jan. 10, 2019

(30) Foreign Application Priority Data
Jul. 6, 2017 (JP) .................. 2017-132536

(51) Int. Cl.
*H03K 19/177* (2006.01)
*G06F 5/06* (2006.01)
*G06F 15/78* (2006.01)
*G06F 17/50* (2006.01)

(52) U.S. Cl.
CPC ....... *H03K 19/17756* (2013.01); *G06F 5/065* (2013.01); *G06F 15/7867* (2013.01); *G06F 17/5054* (2013.01); *H03K 19/17724* (2013.01)

(58) Field of Classification Search
CPC .. G06F 5/065; G06F 15/7867; G06F 17/5054; H03K 19/17724; H03K 19/17756
See application file for complete search history.

(56) References Cited

U.S. PATENT DOCUMENTS

| | | | | |
|---|---|---|---|---|
| 2005/0110518 A1* | 5/2005 | Kanno | ................ | G06F 17/5054 326/39 |
| 2007/0150718 A1* | 6/2007 | Toi | ........................ | G06F 1/3218 713/100 |
| 2011/0179265 A1* | 7/2011 | Tamatani | ............ | G06F 15/7867 713/100 |

FOREIGN PATENT DOCUMENTS

| | | |
|---|---|---|
| JP | 2005-124130 | 5/2005 |
| JP | 2007-179358 | 7/2007 |
| JP | 2015-230619 | 12/2015 |

* cited by examiner

*Primary Examiner* — Alexander H Taningco
*Assistant Examiner* — Kurtis R Bahr
(74) *Attorney, Agent, or Firm* — Fujitsu Patent Center

(57) ABSTRACT

An information processing apparatus includes a processor for an arithmetic processing and a reconfiguration circuit for the arithmetic processing, wherein the reconfiguration circuit includes a plurality of blocks, an inter-block FIFO that couples the blocks, and a common region that is used for a reconfiguration that changes a size of the inter-block FIFO.

8 Claims, 12 Drawing Sheets

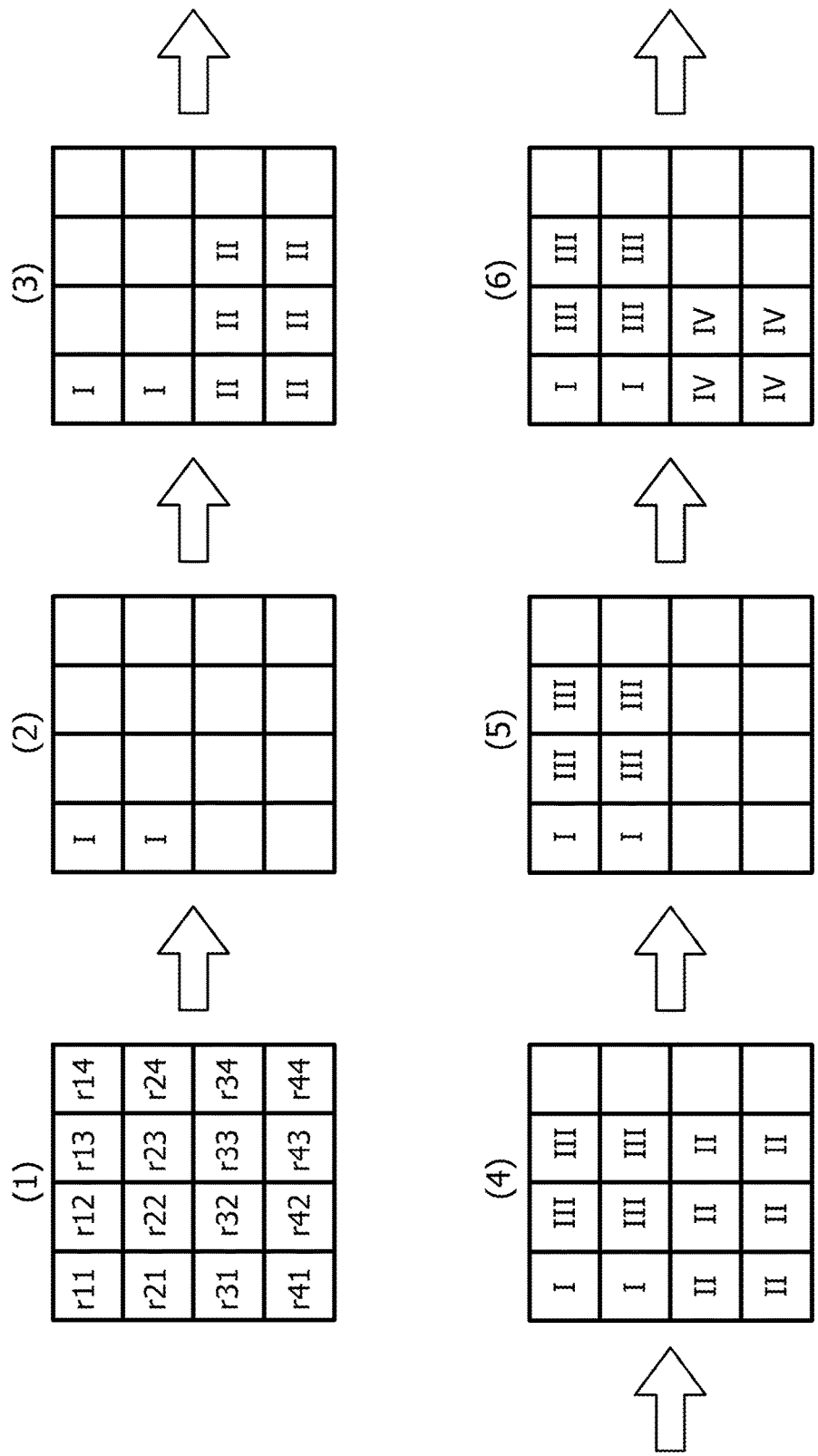

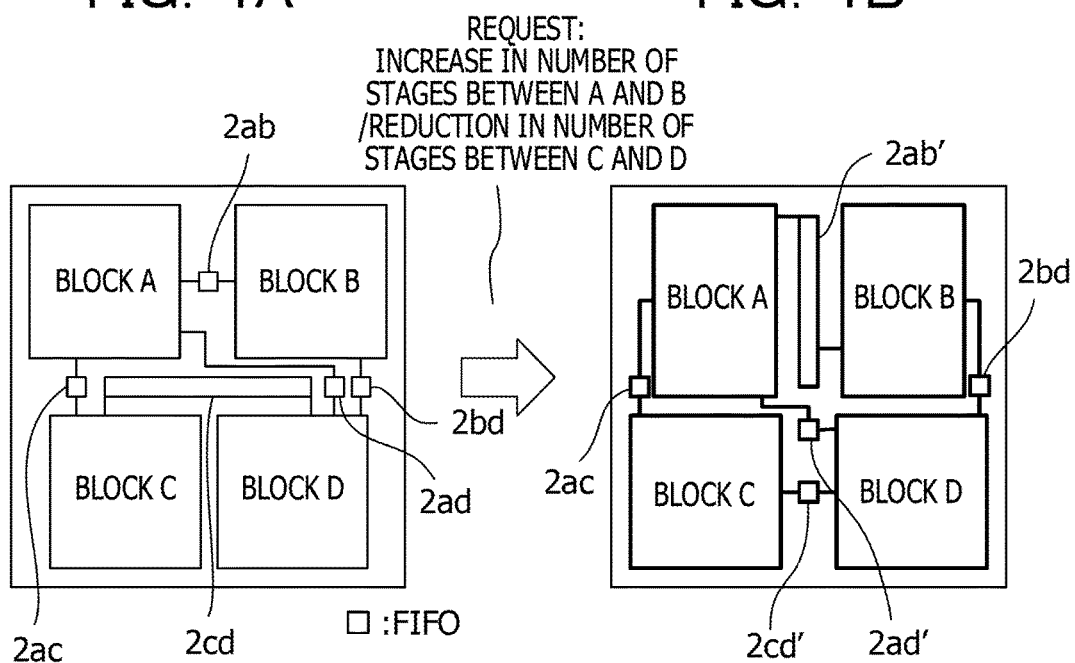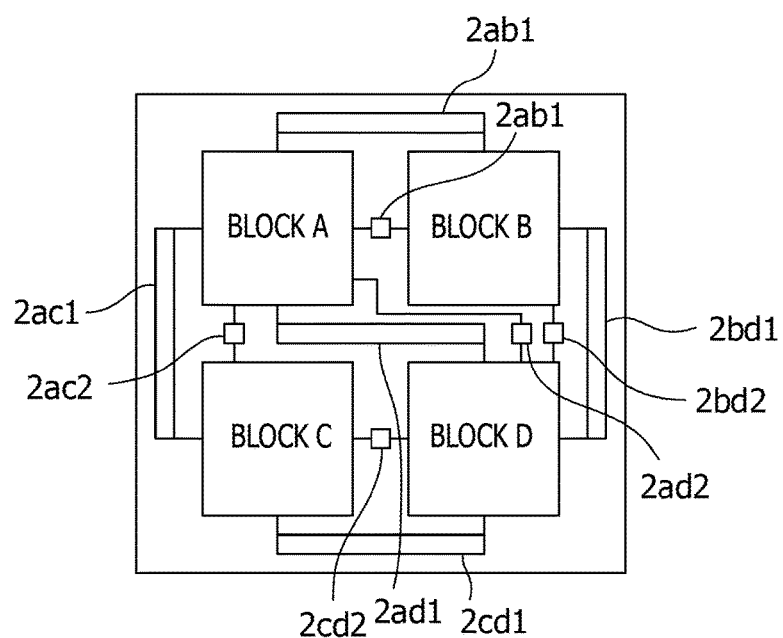

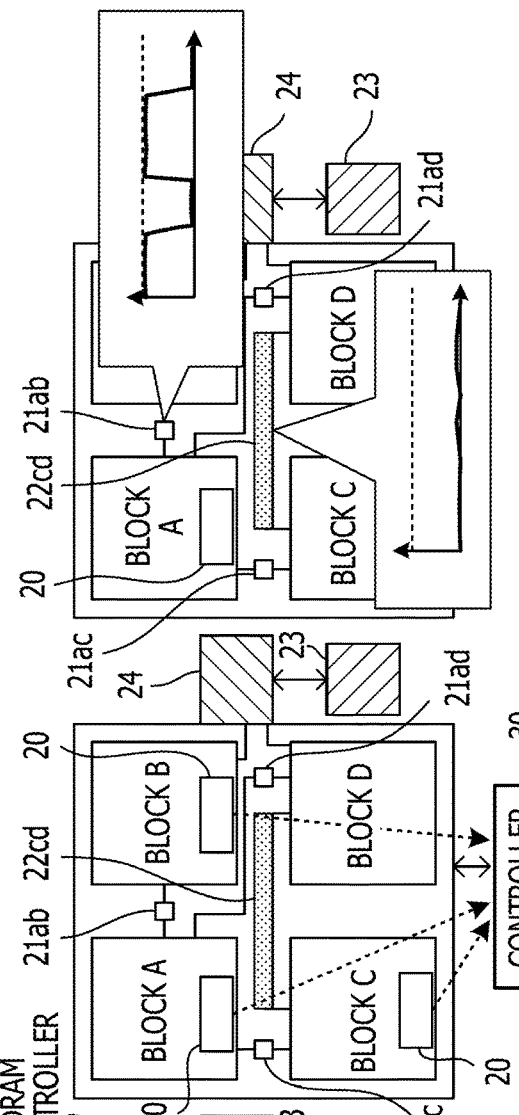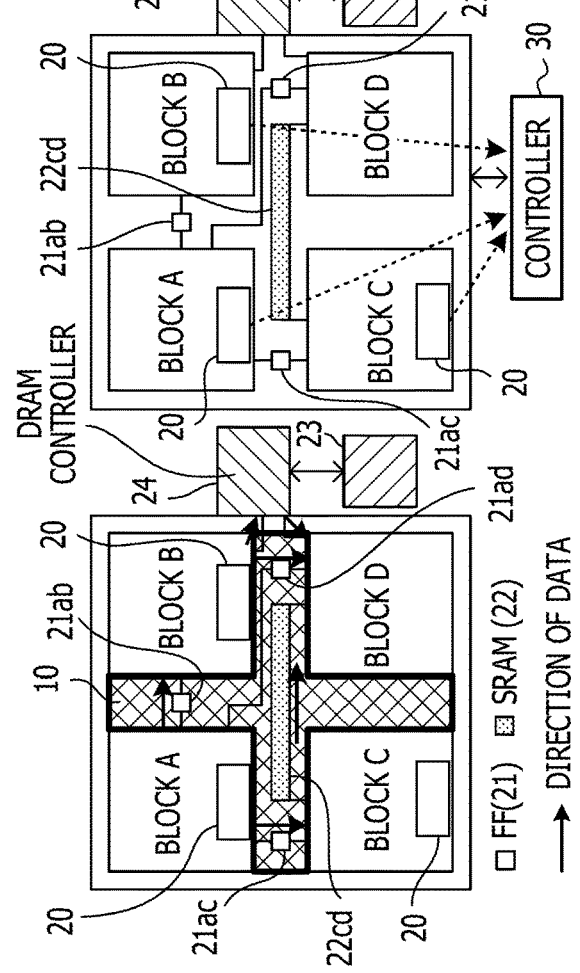

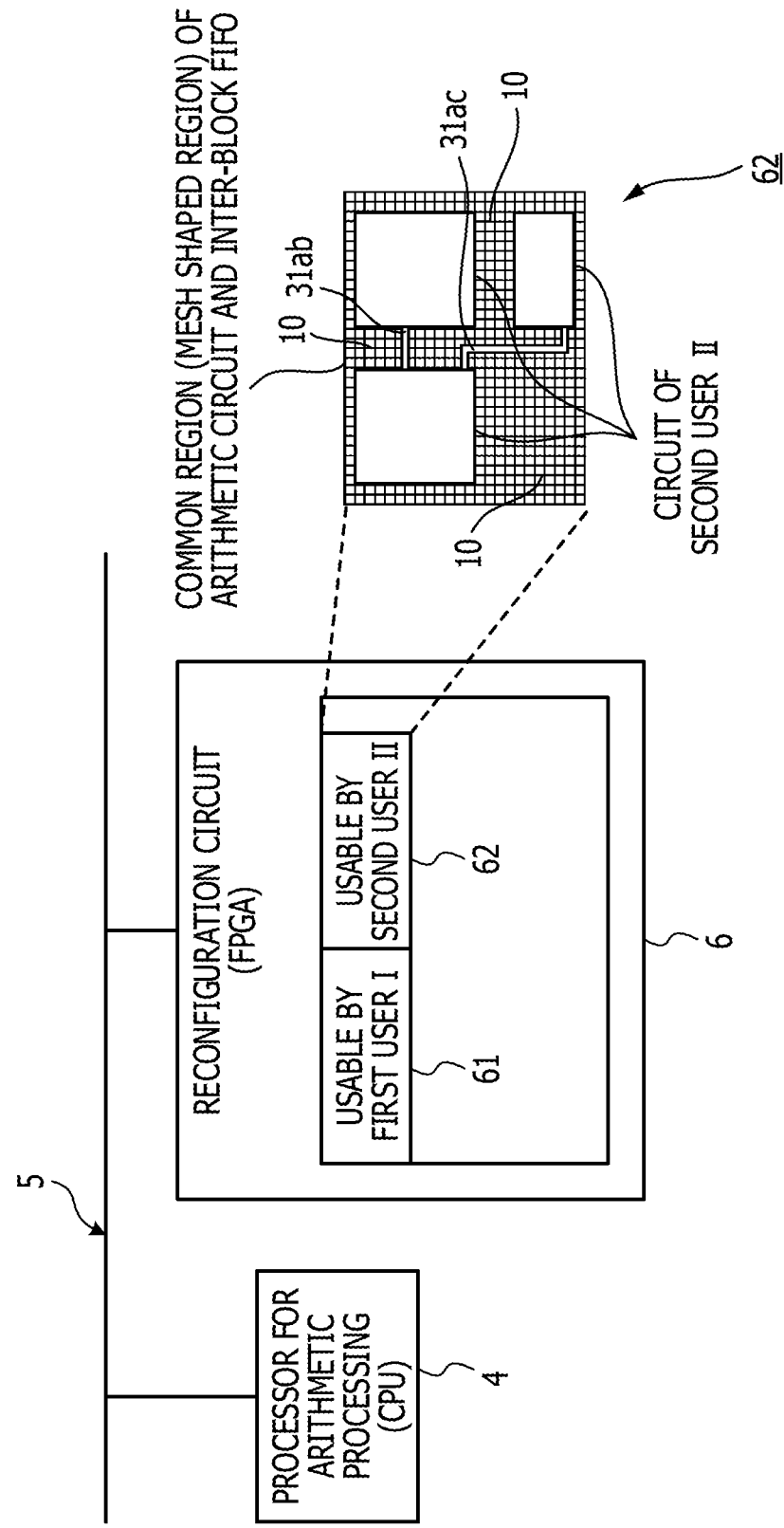

INFORMATION PROCESSING APPARATUS, INFORMATION PROCESSING METHOD, AND COMPUTER-READABLE MEDIUM STORING INFORMATION PROCESSING PROGRAM

CROSS-REFERENCE TO RELATED APPLICATION

This application is based upon and claims the benefit of priority of the prior Japanese Patent Application No. 2017-132536, filed on Jul. 6, 2017, the entire contents of which are incorporated herein by reference.

FIELD

The embodiments discussed herein are related to an information processing apparatus, an information processing method, and an information processing program.

BACKGROUND

In recent years, an arithmetic processing system using a central processing unit (CPU) and a field-programmable gate array (FPGA) is applied in various information processing fields including a data retrieval processing and a moving picture processing. For example, an FPGA accelerator is used for high-speed data processing and low-power data processing as a search processing of search engines on the Internet, a moving picture processing of high efficiency video coding (HEVC: H.265) or the like. For example, since the FPGA can be accelerated by pipelining and parallelization as long as a circuit resource permits, the FPGA is widely used for the search processing, the moving picture processing or the like.

Herein, the FPGA is, for example, an integrated circuit of which configuration can be set up by a purchaser or a designer after manufacturing and it is possible to asynchronously arrange and execute tasks of a plurality of users on one FPGA by utilizing a function of dynamic reconfiguration/partial reconfiguration of the FPGA. For example, even when a user is operating a recording circuit for streaming video on a virtual private server (VPS), and another user sitting next to the user places and executes a database search circuit, it is possible to assure the performance of both users. Further, the task of one user may well be executed.

Related techniques are disclosed in, for example, Japanese Laid-Open Patent Publication Nos. 2005-124130, 2015-230619, and 2007-179358.

SUMMARY

According to one aspect of the embodiments, an information processing apparatus includes a processor for an arithmetic processing; and a reconfiguration circuit for the arithmetic processing, wherein the reconfiguration circuit includes a plurality of blocks, an inter-block FIFO that couples the blocks, and a common region that is used for a reconfiguration that changes a size of the inter-block FIFO.

The object and advantages of the disclosure will be realized and attained by means of the elements and combinations particularly pointed out in the claims. It is to be understood that both the foregoing general description and the following detailed description are exemplary and explanatory and are not restrictive of the disclosure, as claimed.

BRIEF DESCRIPTION OF DRAWINGS

FIG. 1 is a diagram for describing an example of asynchronous execution of a plurality of tasks on a single FPGA;

FIGS. 4A to 4C are diagrams for describing the task in the FPGA mounted circuit;

FIGS. 7A to 7F are diagrams for describing a dynamic reconfiguration of the inter-block FIFO in the information processing apparatus according to the embodiment;

FIG. 9 is a block diagram schematically illustrating an example of the information processing apparatus according to the embodiment;

DESCRIPTION OF EMBODIMENTS

Figure 2A:
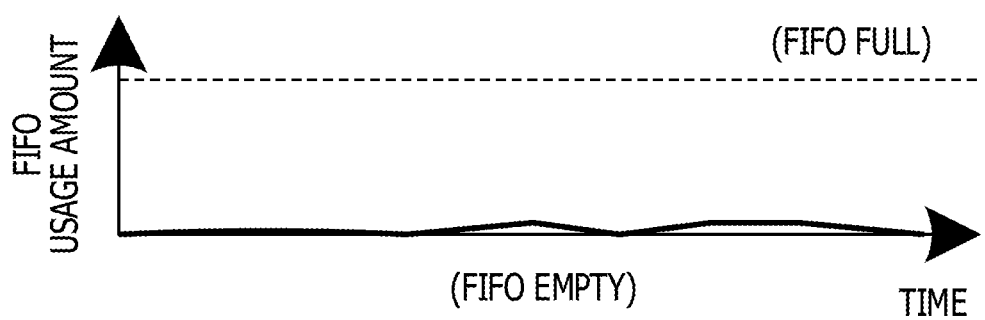
FIGS. 2A and 2B are diagrams for describing a number of stages of an inter-block first-in-first-out (FIFO) in an FPGA mounted circuit.

For example, there is proposed technology in which an arithmetic processing performance of a system is improved by a partial dynamic reconfiguration of the FPGA in an arithmetic processing system in which the CPU and the FPGA are mixed.

In an FPGA mounted circuit equipped with an FPGA (information processing apparatus), depending on an interval between the blocks (e.g., between a logic block or a block circuit), there may be a case when the number of stages (size) of first-in first-out (FIFO) is small so that the number of stages becomes insufficient, or a case when the number of stages of the FIFO is large so that the number of stages becomes excessive. Further, when the FPGA has a plurality of blocks and a configuration of the FPGA is set up, for example, various functions are installed by a user (after product shipment) by specifying the configuration by a hardware description language (HDL). For example, a circuit having various functions may be configured (reconfigured) by the plurality of blocks.

However, for example, it is conceivable to perform a rewriting (reconfiguration) processing for the circuit based on the number of stages of the FIFO for between the respective blocks. However, since all the related blocks are to be rewritten, the throughput is reduced for the amount of time for the reconfiguration processing.

Alternatively, it may be conceivable to set up a plurality of FIFOs having different numbers of stages in advance between the respective blocks, and to select and use a FIFO having an appropriate number of stages depending on the situation. However, when the plurality of FIFOs having different numbers of stages is formed for each between block, a circuit scale becomes large and furthermore, when the number of blocks is large, wiring becomes difficult.

First, before describing the embodiments of an information processing apparatus, an information processing method, and an information processing program in detail, an example and a task of the information processing apparatus will be described with reference to FIG. 1 to FIGS. 4A to 4C. FIG. 1 is a diagram for describing an example of asynchronous execution of a plurality of tasks on a single FPGA and illustrate a case where circuits are asynchronously arranged by a dynamic reconfiguration/partial reconfiguration of the FPGA and non-existence situations of FPGA arithmetic resources are changed one by one.

(1) of FIG. 1 illustrates an initial state, (2) of FIG. 1 illustrates a state of allocation/use start of first user I, and (3) of FIG. 1 illustrates a state of allocation/use start of second user II. Further, (4) of FIG. 1 illustrates a state of allocation/use start of third user III, (5) of FIG. 1 illustrates a state of use completion of second user II, and (6) of FIG. 1 illustrates a state of allocation/use start of fourth user IV. Further, other running circuits are configured not to stop.

As illustrated in (1) of FIG. 1, in the initial state, all arithmetic resources (regions) r11 to r44 are not used and are in an empty state, and when regions r11 and r21 are used by the first user I, the regions r11 and r21 become the state illustrated in (2) of FIG. 1. Subsequently, when the regions r31, r32, r33, r41, r42, and r43 are used by the second user II, the regions become the state illustrated in (3) of FIG. 1. When the regions r12, r13, r22, and r23 are used by the third user III, these regions become the state illustrated in (4) of FIG. 1.

As illustrated in (5) of FIG. 1, when the use of the second user II is completed, the regions r31, r32, r33, r41, r42, and r43 used by the user II become empty. Then, as illustrated in (6) of FIG. 1, the fourth user IV uses the empty regions r31, r32, r41, and r42. By continuing allocation processing of the regions (arithmetic resources), it is possible to, for example, asynchronously execute a plurality of tasks by a plurality of users.

Figure 2B:
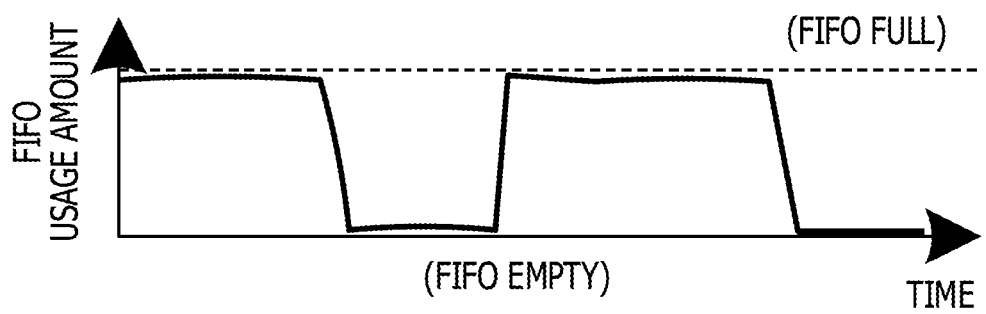

FIGS. 2A and 2B are diagrams for describing the number of stages (size) of an inter-block FIFO in an FPGA mounted circuit. FIG. 2A illustrates a case where the number of stages of first-in first-out (FIFO) is larger than necessary, and FIG. 2B illustrates a case where the number of stages of the FIFO is not sufficient. Herein, in FIGS. 2A and 2B, a vertical axis represents a usage amount of the FIFO and a horizontal axis represents time. Further, as a premise, it is assumed that each user arranges a plurality of circuit blocks (blocks) within a region allocated onto the FPGA and the respective blocks communicate with each other via the FIFO.

However, there is a case in which only the number of stages of the inter-block FIFO is changed in accordance with a mode change of the block and there is a processing in which the processing result is improved by increasing the information to be referred even when the processing contents of a core are the same. For example, in an HEVC encoder circuit having an FIFO-type frame memory, for example, in a low delay mode, a frame memory for several coding tree unit (CTU) lines may be used. However, in a high definition mode, a frame memory for several tens of frames is required.

Further, there is a case where the number of stages of the inter-block FIFO does not match data to be input and the processing speed may be increased by changing the number of stages of the FIFO. For example, as illustrated in FIG. 2A, when the number of stages of the FIFO is larger than necessary, the FIFO is, for example, continuously in a state close to an empty state, so that a circuit scale becomes useless.

In the meantime, as illustrated in FIG. 2B, when the number of stages of the FIFO is insufficient, the FIFO changes extremely (e.g., empty→full→empty→ . . . ) so that the performance difference between two blocks may not be absorbed, resulting in a decrease in performance. For example, since the FIFO may not absorb the difference in processing speed between an input-side block and an output-side block of the FIFO, the overall processing speed decreases.

Figure 3A:
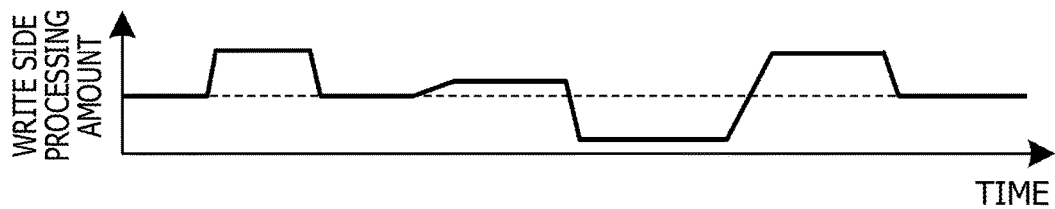
FIGS. 3A to 3D are diagrams for describing performance of each circuit via an input/output FIFO.
Figure 3B:
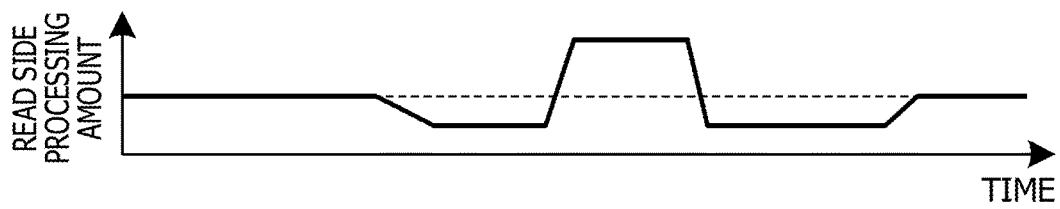
Figure 3C:
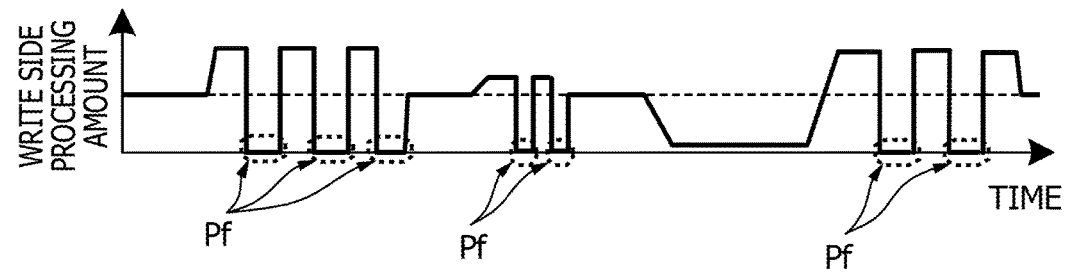
Figure 3D:
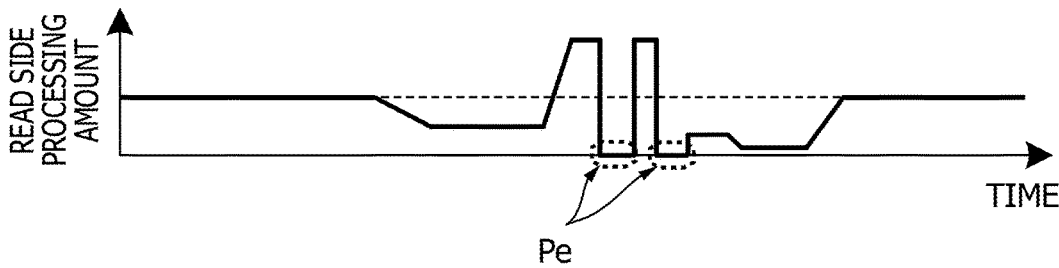

FIGS. 3A to 3D are diagrams for describing the performance of each circuit via input/output FIFO. Herein, FIGS. 3A and 3B illustrate a case where a circuit that writes input/output FIFO (write side) and a circuit that reads the input/output FIFO (read side) have the same average processing amount, but the processing amount temporarily fluctuates up and down. Further, FIGS. 3C and 3D illustrate a case where the number of stages of the input/output FIFO is small and a temporary change of the processing speed of each circuit may not be absorbed, and as a result, an overall performance deteriorates. In addition, in FIGS. 3A and 3C, the vertical axis represents the processing amount of the write side and in FIGS. 3B and 3D, the vertical axis represents the processing amount of the read side and in each drawing, the horizontal axis represents the time.

As illustrated in FIGS. 3A and 3B, for example, in the case of data compression processing, the length of output data does not become constant with respect to the length of input data, and changes (fluctuates) with time. Further, as illustrated in FIG. 3C, in a period Pf, in order for the write side (write circuit) to wait until the FIFO becomes empty, the processing at the write side stops. Furthermore, as illustrated in FIG. 3D, in a period Pe, in order for the read side (read circuit) to wait for data (input data) from the FIFO, the processing at the read side stops.

FIGS. 4A to 4C are diagrams for describing the task in the FPGA mounted circuit. FIG. 4A illustrates an initial configuration, FIG. 4B is a diagram for describing countermeasure 1, and FIG. 4C is a diagram for describing countermeasure 2. As illustrated in FIG. 4A, it is assumed that in the initial configuration of the FPGA mounted circuit, the number of stages of the FIFO is small (insufficient) between blocks A and B and the number of stages of the FIFO is large (excessive) between blocks C and D. For example, it is assumed that the number of stages of the FIFO (2ab) between the blocks A and B is requested to be increased and the number of stages of the FIFO (2cd) between the blocks C and D is requested to be reduced.

As illustrated in FIG. 4B, it may be conceived that in the countermeasure 1, rewrite (reconfiguration) processing of all circuits is performed to increase the number of stages by setting the FIFO between the blocks A and B from 2ab to 2ab' and reduce the number of stages by setting the FIFO between the blocks C and D from 2cd to 2cd'. For example, it is conceivable to improve the throughput by changing the number of stages of the FIFO based on a request by mapping according to the state of the system.

However, in the countermeasure 1, for example, even when changing only the number of stages of the FIFO among a portion of blocks, all of the related blocks are rewritten and the throughput decreases for the time amount for the reconfiguration processing. For example, since the reconstruction processing of rewriting all of the blocks takes a considerable amount of time, when the reconfiguration processing is frequently performed to, for example, control the number of stages of the FIFO, the throughput may decrease instead.

As illustrated in FIG. 4C, in the countermeasure 2, for example, a plurality of FIFOs (e.g., two FIFOs in FIG. 4C) with different numbers of stages is previously set among the blocks A to D and it is conceivable to select and use a FIFO with an appropriate number of stages according to the situation. For example, as two FIFOs with different numbers of stages, 2ab1 and 2ab2 are set between the blocks A and B, 2ac1 and 2ac2 are set between the blocks A and C, and 2ad1 and 2ad2 are set between the blocks A and D. Further, 2bd1 and 2bd2 are set between the blocks B and D and 2cd1 and 2dd2 are set between the blocks C and D. In addition, it is assumed that there is no data transfer between the blocks B and C via the FIFO, and no FIFO is set.

Further, as illustrated in FIG. 4C, it may be conceived that by setting the plurality of FIFOs having different numbers of stages, the FIFO having the appropriate number of stages is selected according to the request of the number of FIFO stages according to a processing situation at that time (e.g., 2ab1, 2bd2, 2ac2, and 2ad2 corresponding to FIG. 4B are selected).

However, in the countermeasure 2, the circuit scale becomes large because form the plurality of FIFOs having different numbers of stages are formed between the respective blocks and furthermore, when the number of blocks is large, the wiring may become difficult.

Figure 5:
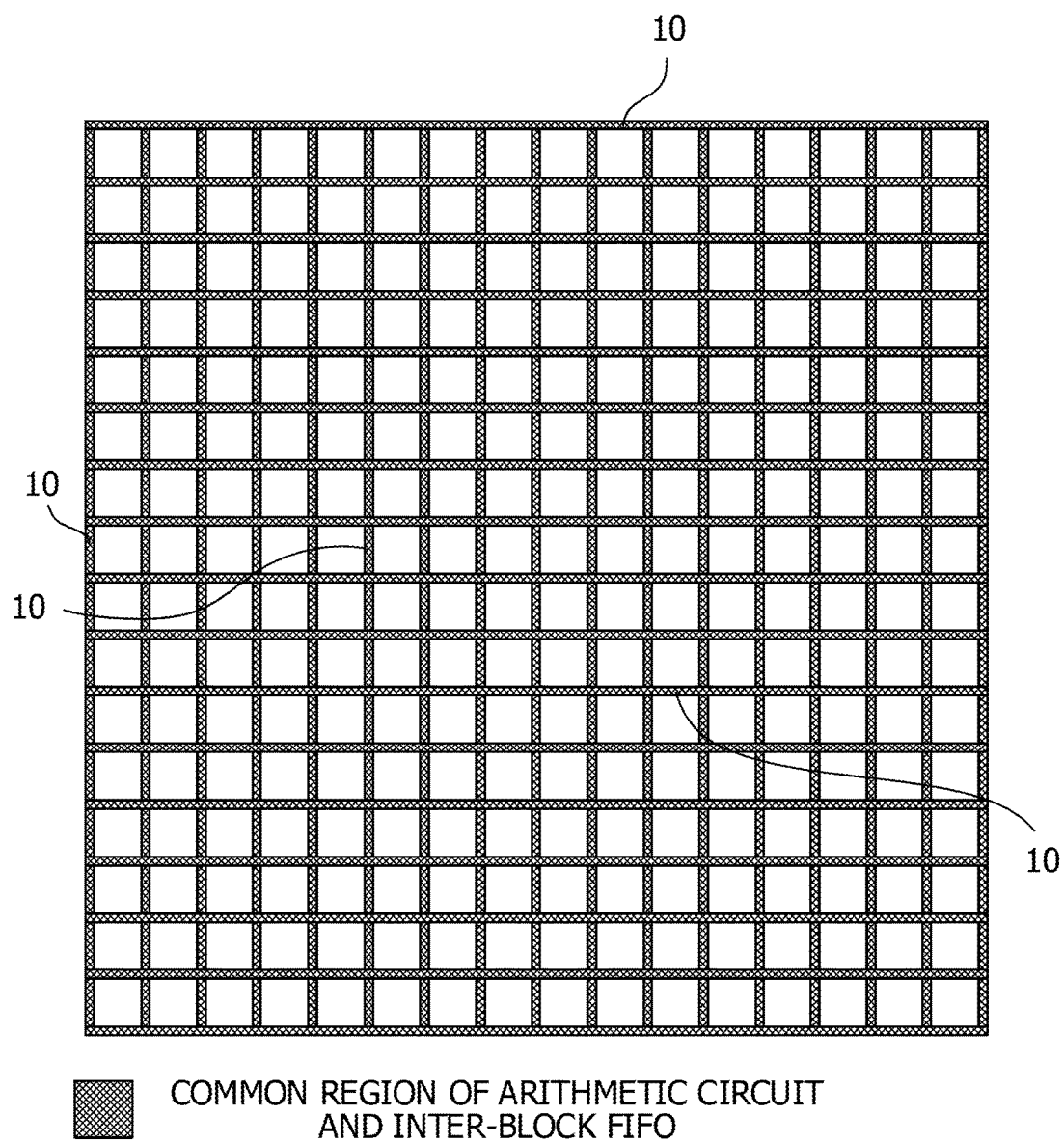
FIG. 5 is a diagram schematically illustrating an overall configuration of an example of FIFO in an information processing apparatus according to the embodiment.

Hereinafter, the embodiments of the information processing apparatus, the information processing method, and the information processing program will be described in detail with reference to the accompanying drawings. FIG. 5 is a diagram schematically illustrating an overall configuration of an example of FIFO in an information processing apparatus of the embodiment. In FIG. 5, lattice-like portions illustrated by cross hatching indicate a common region 10 of an arithmetic circuit and block FIFO.

In the information processing apparatus according to the embodiment, the inter-block FIFO that performs a communication between the blocks may be arranged only in a common region 10 set on the FPGA (the common area of the arithmetic circuit and the block FIFO). Then, as for the number of stages (size) of the inter-block FIFO, the appropriate number of stages may be acquired in each inter-block FIFO based on a usage state of each inter-block FIFO, and the number of stages of the FIFO may be dynamically changed only by reconfiguration of the common region 10. Further, when the bit width is changed and the number of stages of the FIFO is changed, the reconfiguration of the common area 10 is performed.

Herein, respective FIFOs are arranged in any one of, for example, a flip-flop (FF), on-chip static random access memory (SRAM), or a dynamic random access memory (DRAM). For example, the FIFO is selected based on the capacity (size) thereof and the FF is selected when the capacity is small, the DRAM is selected when the capacity is large, and the SRAM is selected when the capacity is medium (between the small capacity when the FF is selected and the large capacity when the DRAM is selected). Further, in the case of selecting the DRAM as the FIFO, a response time is larger (longer) than in the case of selecting the FF or the SRAM, and as a result, the DRAM may be selected, for example, only for processing capable of concealing a read time.

In changing the number of stages of the FIFO by reconfiguring the common region 10, an empty capacity of each FIFO is monitored to dynamically change an FIFO configuration (the number of stages of the FIFO) according to the state. Herein, the inter-block FIFO in which the empty capacity is always large is set as a subject for reduction in the number of stages and the inter-block FIFO in which the amplitude of the empty capacity is large is set as a subject for increase in the number of stages. Further, the dynamic change of the number of stages of the inter-block FIFO is made after emptying the FIFO before the change and furthermore, when there is FIFO that may be diverted, new FIFO is not arranged and the wiring to the divertible FIFO is changed. In addition, the dynamic change may be made only when the bit widths match with each other and the number of stages is sufficient.

Figure 6:
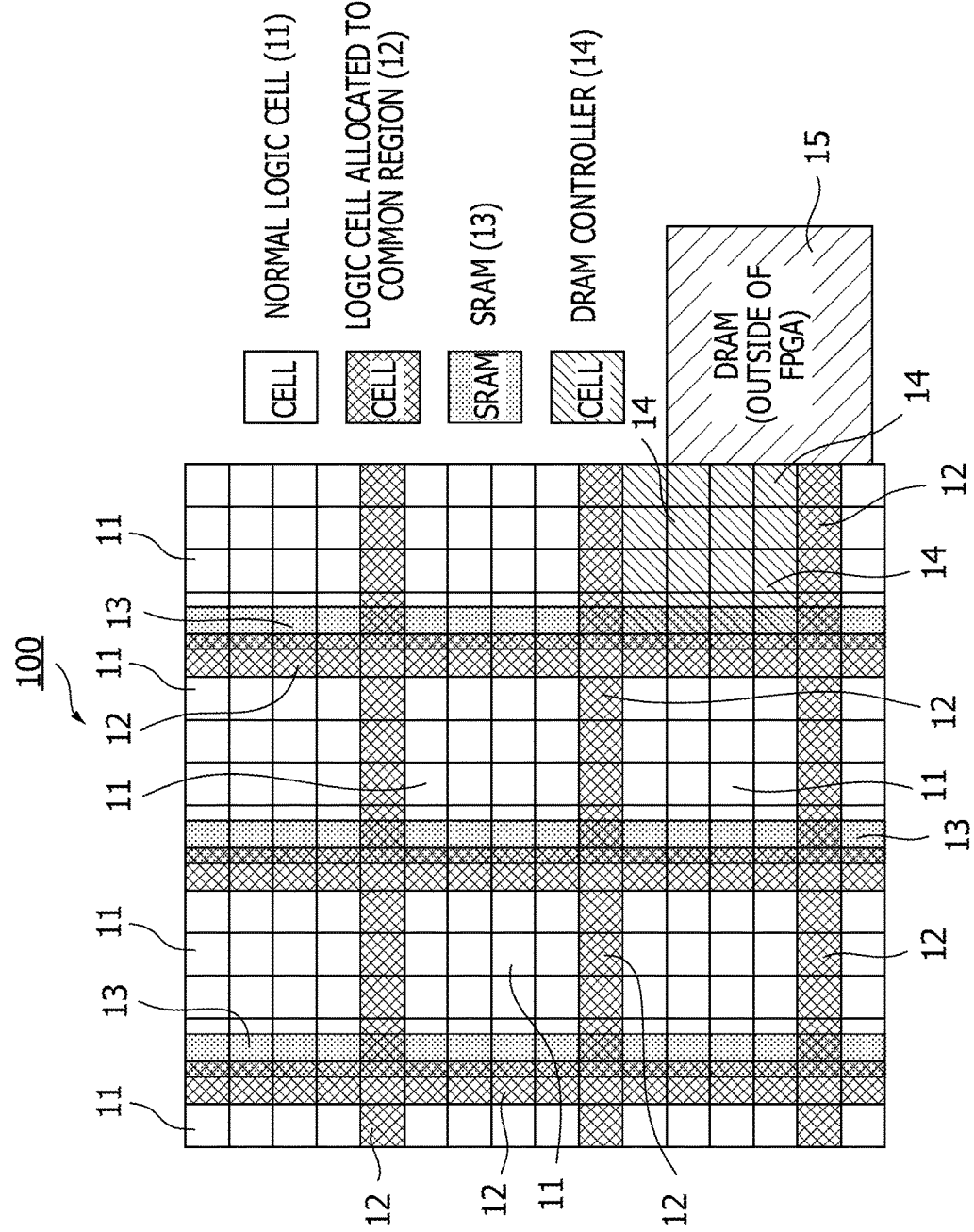
FIG. 6 is a diagram schematically illustrating an example of an array destination of the FIFO in the information processing apparatus according to the embodiment.

FIG. 6 is a diagram schematically illustrating an example of an array destination of the FIFO in the information processing apparatus according to the embodiment. In FIG. 6, reference numeral 100 denotes a reconfiguration circuit (FPGA), reference numeral 11 denotes a normal logic cell, reference numeral 12 denotes a logic cell allocated to the common region, reference numeral 13 denotes the SRAM, reference numeral 14 denotes a DRAM controller, and reference numeral 15 denotes the DRAM.

As illustrated in FIG. 6, in the FPGA 100, logically rewritable cells (the normal cell 11 and the logic cell 12 allocated to the common region) are arranged in an array type and the DRAM controller 14 is arranged in the normal cell 11. Herein, the flip-flop (FF) and a lookup table (LUT) are included in each cell 11 or 12. Further, the SRAM 13 is arranged in a band shape on the FPGA 100 and the DRAM 15 is coupled to, for example, the outside of the FPGA 100.

Herein, as the array destination of the FIFO, the FIFO is arranged in, for example, the DRAM 15, the SRAM 13, or the FF within the logic cell 12 allocated to the common region. Further, the DRAM 15 is controlled by the DRAM controller 14 installed in the FPGA 100 and the block using the FIFO on the DRAM 15 is coupled to the DRAM controller 14. Herein, the DRAM 15 is selected when the capacity is large, the SRAM 13 is selected when the capacity is medium, and the FF is selected when the capacity is small as described above.

Figure 7D:
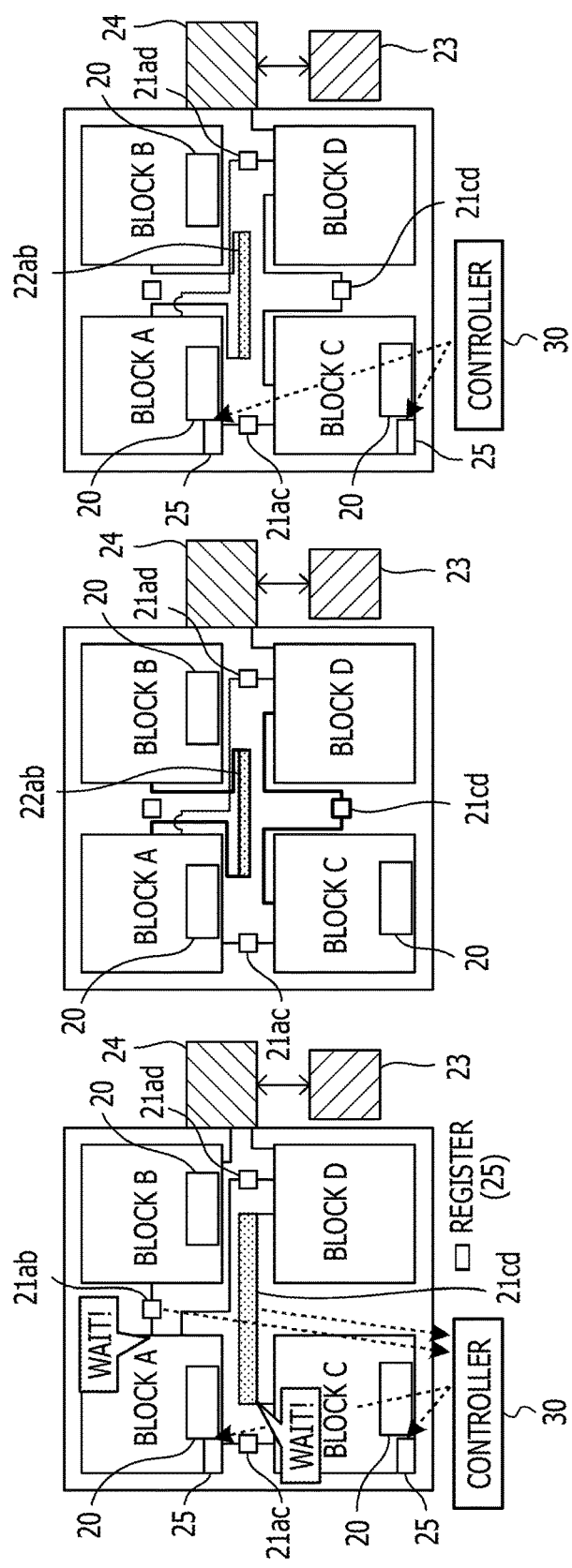
Figure 7E:
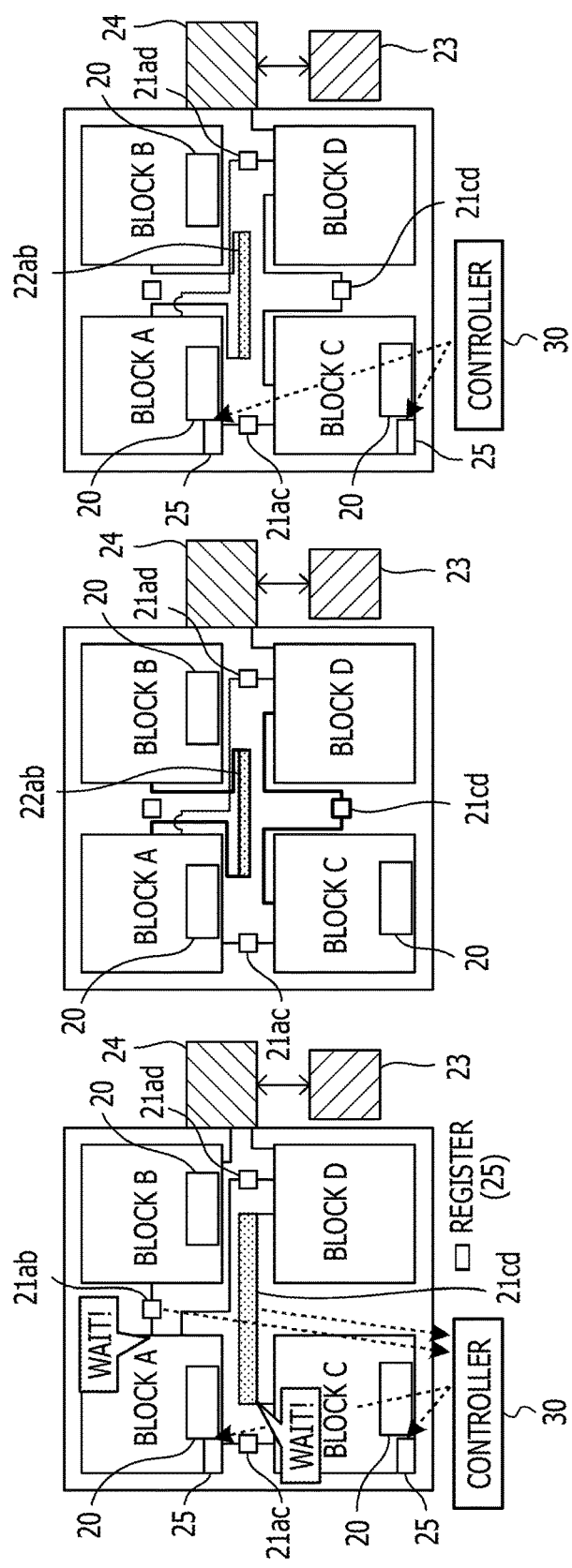
Figure 7F:
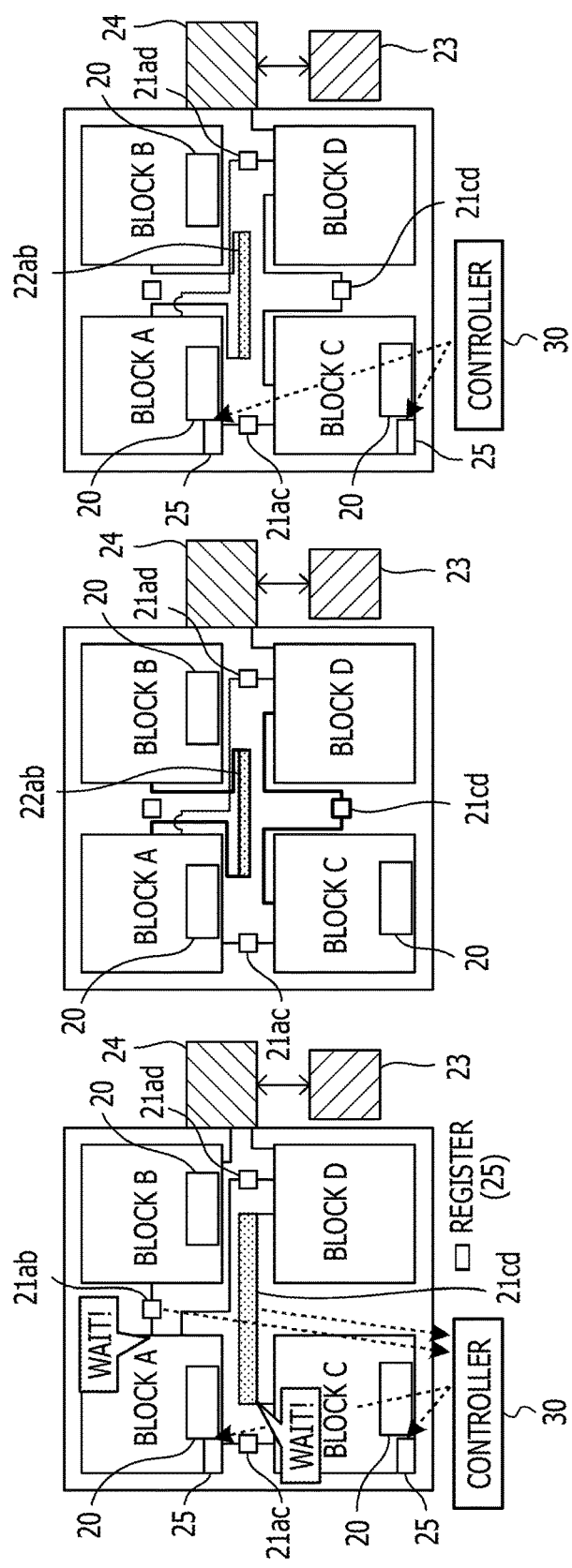

FIGS. 7A to 7F are diagrams for describing a dynamic reconfiguration of the inter-block FIFO in the information processing apparatus of the embodiment. Herein, FIG. 7A illustrates the initial state, FIG. 7B illustrates a state in which the empty capacity of each inter-block FIFO is periodically notified to a control mechanism unit via a register, FIG. 7C illustrates a state in which the reconfiguration is determined, and FIG. 7D illustrates a state of waiting until the FIFO to be changed becomes empty after issuing a request for stopping writing in a block that performs writing in the FIFO to be changed. Further, FIG. 7E illustrates a state in which the FIFO to be changed becomes empty and thereafter, is reconfigured and FIG. 7F illustrates a state of requesting restart of processing with respect to a circuit in which the FIFO is changed.

Even in the following description, in the same manner as described with reference to FIGS. 4A to 4C, it is assumed that the number of stages is requested to increase due to the insufficient number of stages of the FIFO between the blocks A and B and the number of stages is requested to decrease due to the excessive number of stages of the FIFO between the blocks C and D. Further, in FIG. 7A, reference numeral 10 denotes the common region described with reference to FIG. 5 (the common region of the arithmetic circuit and the block FIFO) and includes the FIFOs by the FF (21ab, 21ac, 21ad, and 21cd) and the FIFOs by the SRAM 13 (22ab and 22cd). Further, reference numeral 20 denotes a capacity monitoring unit and reference numeral 30 denotes the control mechanism unit. In addition, the capacity monitoring unit 20 is set in the blocks A to C, and periodically monitors the empty capacity of the FIFO and notifies the control mechanism unit 30 of the empty capacity.

Herein, in FIGS. 7B to 7F, the common region 10 is omitted for the sake of simplicity. In addition, the blocks B and D using the FIFO by the DRAM 23 access the DRAM 23 via the DRAM controller 24. The DRAM 23 and the DRAM controller 24 in FIGS. 7A to 7F correspond to, for example, the DRAM 15 and the DRAM controller 14 (cell for the DRAM controller) in FIG. 6 described above.

In the information processing apparatus according to the embodiment, the array destination of the FIFO is, for example, the DRAM, the SRAM, or the FF. For example, when the capacity (size) is large, the DRAM 23 is selected, when the capacity is medium, the SRAMs (FIFOs by SRAM) 22ab and 22cd are selected, and when the capacity is small, the FFs (FIFOs by the FF) 21ab, 21ac, 21ad, and 21cd are selected. Further, the SRAM and the DRAM are merely examples and, for example, may be other memories such as ferroelectric random access memory (FeRAM: FRAM (registered trademark)).

First, in the configuration of the initial state illustrated in FIG. 7A, as illustrated in FIG. 7B, the capacity monitoring unit 20 set in each of the blocks A to D periodically monitors the empty capacity of the FIFO and notifies the control mechanism unit 30 of the monitored empty capacity. Here, as illustrated in FIG. 7C, it is described that the control mechanism unit 30 determines that the number of stages of the FIFO is excessive and the number of stages of the FIFO is insufficient based on the empty capacity of the FIFO by the capacity monitoring unit 20 as described with reference to, for example, FIGS. 2A and 2B. For example, it is requested to increase the number of stages (size) of the FIFO due to the insufficient number of stages of the FIFO between the blocks A and B and it is requested to reduce the number of stages of the FIFO due to the excessive number of stages of the FIFO between the blocks C and D. In such a manner, FIFOs to be changed (21ab and 22cd) are specified.

In this case, as illustrated in FIG. 7D, in order to empty the FIFOs to be changed (21ab and 22cd), a stall request is issued to the block on the write side and waiting is performed until the FIFO to be changed becomes empty. For example, the control mechanism unit 30 instructs stopping the writing by the block A to the FIFO (21ab) of FF and the writing by the block C to the FIFO (22cd) of SRAM via the registers 25 of the blocks A and C and then waits until 21ab and 22cd become empty.

Next, as illustrated in FIG. 7E, when the FIFOs to be changed (21ab and 22cd) become empty, an FIFO part is reconfigured. For example, between the blocks A and B in which an increase in the number of stages of the FIFO is requested, the FIFO (21ab) of the FF is changed to the FIFO (22ab) of the SRAM, and between the blocks C and D in which the reduction in the number of stages of the FIFO is requested, the FIFO (22cd) of the SRAM is changed to the FIFO (21cd) of the FF. Further, when there is the divertible FIFO, the FIFO may be reused (reconfigured only by the wiring). Here, the reconfiguration of the FIFO parts (21ab, 22cd, 22ab, and 21cd) is a reconfiguration of only the common region 10, and the blocks A to D and other FIFOs (21ac and 21ad) are not changed.

Further, as illustrated in FIG. 7F, processing restart is requested with respect to the changed FIFOs (22ab and 21cd). For example, the control mechanism unit 30 instructs restarting the writing by the block A to the FIFO (22ab) of SRAM and the writing by the block C to the FIFO (21cd) of FF via the registers 25 of the blocks A and C. As described above, according to the information processing apparatus of the embodiment, it is possible to dynamically change the FIFO between the blocks while suppressing an increase in the time and circuit scale for the reconfiguration processing.

Figure 8A:
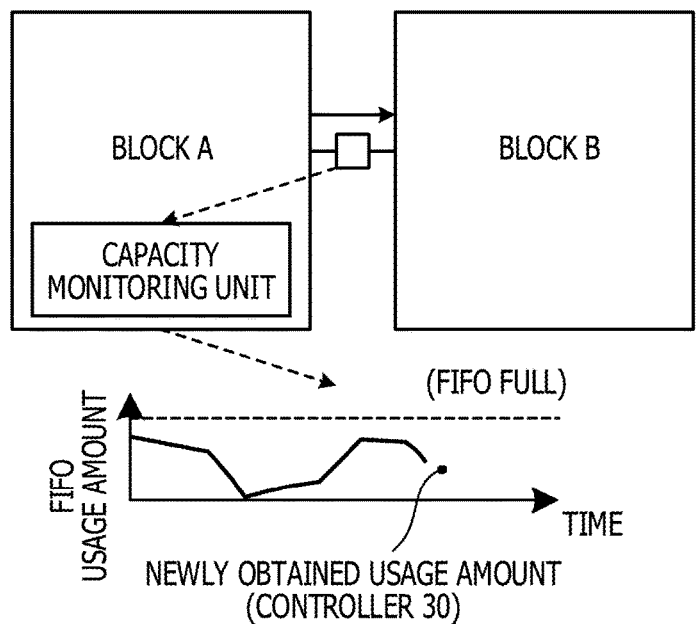
FIGS. 8A and 8B are diagrams for explaining an example of a capacity monitoring method of the inter-block FIFO in the dynamic reconfiguration of the inter-block FIFO illustrated in FIGS. 7A to 7F.
Figure 8B:
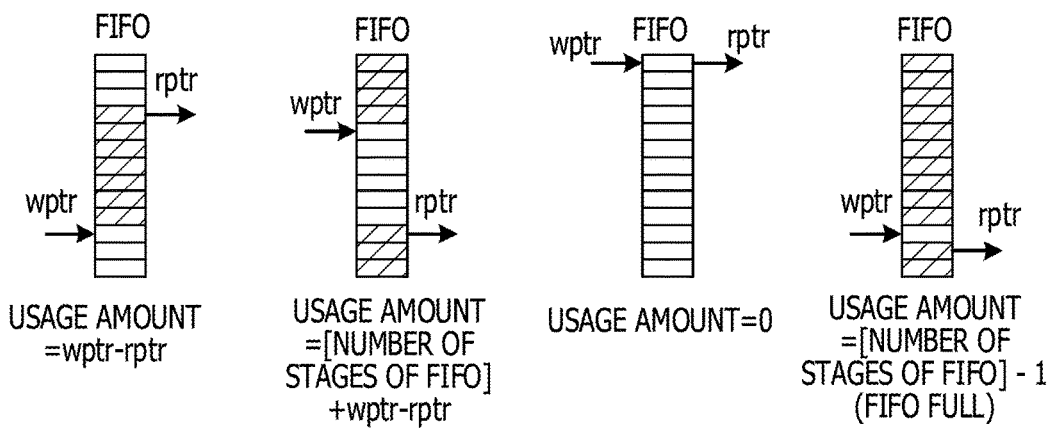

FIGS. 8A and 8B are diagrams for explaining an example of a capacity monitoring method of the inter-block FIFO in the dynamic reconfiguration of the inter-block FIFO illustrated in FIG. 7. Herein, FIG. 8A is used for describing the capacity monitoring unit 20 of the block A for monitoring a usage amount of the FIFO (21ab) between the blocks A and B and FIG. 8B is used for describing calculation of the usage amount of the FIFO.

As illustrated in FIG. 8A, for example, when the block A writes data to the 21ab and the block B reads data from the 21ab in the blocks A and B, the capacity monitoring unit 20 set in the block A monitors the empty capacity of the FIFO in 21ab. Herein, in the monitoring of the empty capacity of the FIFO by the capacity monitoring unit 20, for example, a history is stored by periodically calculating the usage amount of the FIFO to be monitored. Then, the control mechanism unit 30 periodically reads the history of the usage amount stored in the capacity monitoring unit 20 set in each block. Further, in FIG. 8A, the empty capacity of the FIFO (21ab) is monitored by the capacity monitoring unit 20 of the block A that performs writing to the FIFO, but may be monitored by, for example, the capacity monitoring unit 20 of the block B that performs reading from the FIFO.

As illustrated in FIG. 8B, the usage amount (the number of used stages) of the FIFO is obtained from, for example, the difference between a write pointer (wptr) and a read pointer (rptr) of the FIFO (21ab). For example, the usage amount of the FIFO may be obtained from, for example, usage amount=wptr−rptr or usage amount=[the number of stages of FIFO]+wptr−rptr. Further, in the case of rptr==wptr, the usage amount becomes zero (all empty) and in the case of rptr==wptr+1, the usage amount becomes full. Further, FIGS. 8A and 8B are merely for describing an example and various techniques may be applied thereto.

FIG. 9 is a block diagram schematically illustrating an example of the information processing apparatus according to the embodiment. As illustrated in FIG. 9, the information processing apparatus of the embodiment includes, for example, an arithmetic processing unit (CPU) 4, a reconfiguration circuit (FPGA) 6, and a bus 5. Herein, the bus 5 is used for coupling the CPU 4 and the FPGA 6 and exchanging various commands and data.

For example, the FPGA 6 includes a region 61 usable by the first user I and a region 62 usable by the second user II and the region 62 usable by the second user II includes blocks IIA, IIB, and IIC. Between the blocks IIA and IIB, FIFO (inter-block FIFO: 31ab) is set and the data from the block IIA is transmitted to the block IIB via the 31ab. Further, between the blocks IIA and IIC, FIFO (31ac) is set and the data from the block IIA is transmitted to the block IIC via the 31ab. Herein, the FIFOs (31ab and 31ac) are set in the common region 10 described with reference to FIG. 5.

For example, the information processing apparatus according to the embodiment may dynamically change a part of the circuit by using both the CPU 4 and the reconfiguration circuit 6. For example, it is possible to asynchronously perform an operation requested to a plurality of users using both the CPU 4 and the reconfiguration circuit 6. In addition, the FPGA (reconfiguration circuit 6) includes circuits (e.g., the blocks IIA to IIC) which may be freely arranged in the regions 61 and 62 (e.g., the region 62) usably allocated to each of the users I and II. Herein, each of the blocks IIA to IIC is, for example, a block (circuit block) for implementing predetermined hardware processing and is coupled with other blocks through the FIFOs (31ab and 31ac). Further, the FIFOs (31ab and 31ac) may be set in the common region 10 and the number of stages of the FIFOs (31ab and 31ac) may be dynamically changed only by the reconfiguration of the common region 10.

As described with reference to FIGS. 7A to 7E, each of the blocks IIA to IIC may desirably have a function of stopping writing to an arbitrary FIFO by setting the register 25 by, for example, the CPU 4. In addition, each of the blocks IIA to IIC may have the capacity monitoring unit (20) for periodically monitoring the empty capacity of the FIFO arranged between the blocks and notifying the control mechanism unit 30 of the monitored empty capacity. Further, the FIFO is arranged in, for example, the FF or the SRAM on the FPGA 6 or the DRAM installed outside the FPGA 6. Herein, when the FIFO is arranged in the DRAM outside the FPGA, for example, wiring (reconfiguration) of the block accessible to the DRAM may be dynamically performed only by the reconfiguration of the common area 10. Further, the embodiment may be implemented, for example, as software (program) that operates on the CPU 4 and an example of the processing is described with reference to FIG. 10.

Further, an information processing method (information processing program) according to the embodiment performs, for example, the following processing. First, the common region 10 is secured on the regions 61 and 62 usable by the respective users I and II. Herein, the inter-block FIFOs (31ab and 31ac) may be arranged only in the common region 10 and the number of stages of the inter-block FIFOs (31ab and 31ac) may be changed without changing the blocks IIA, IIB, and IIC only by the reconfiguration of the common region 10.

Further, for example, the empty capacities of the respective inter-block FIFOs (31ab and 31ac) periodically monitored by the capacity monitoring unit 20 described above are notified to the control mechanism unit 30. For example, the control mechanism unit 30 periodically collects information on the empty capacity of each inter-block FIFO, detects the inter-block FIFO having a problem in the empty capacity (the number of stages) of the FIFO, and determines an appropriate number of stages for the detected inter-block FIFO. Further, a block that performs writing to the detected inter-block FIFO is requested (controlled) to temporarily stop the writing. In addition, when it is detected that there is no valid data (empty state) in, for example, the inter-block FIFO detected from a value of the register 25, the number of stages of the detected inter-block FIFO is changed by reconfiguring only the common region 10. Furthermore, when the reconfiguration of a new inter-block FIFO is completed, processing resumption is requested to a block that performs writing to the new inter-block FIFO and the processing is performed via the new inter-block FIFO.

Figure 10:
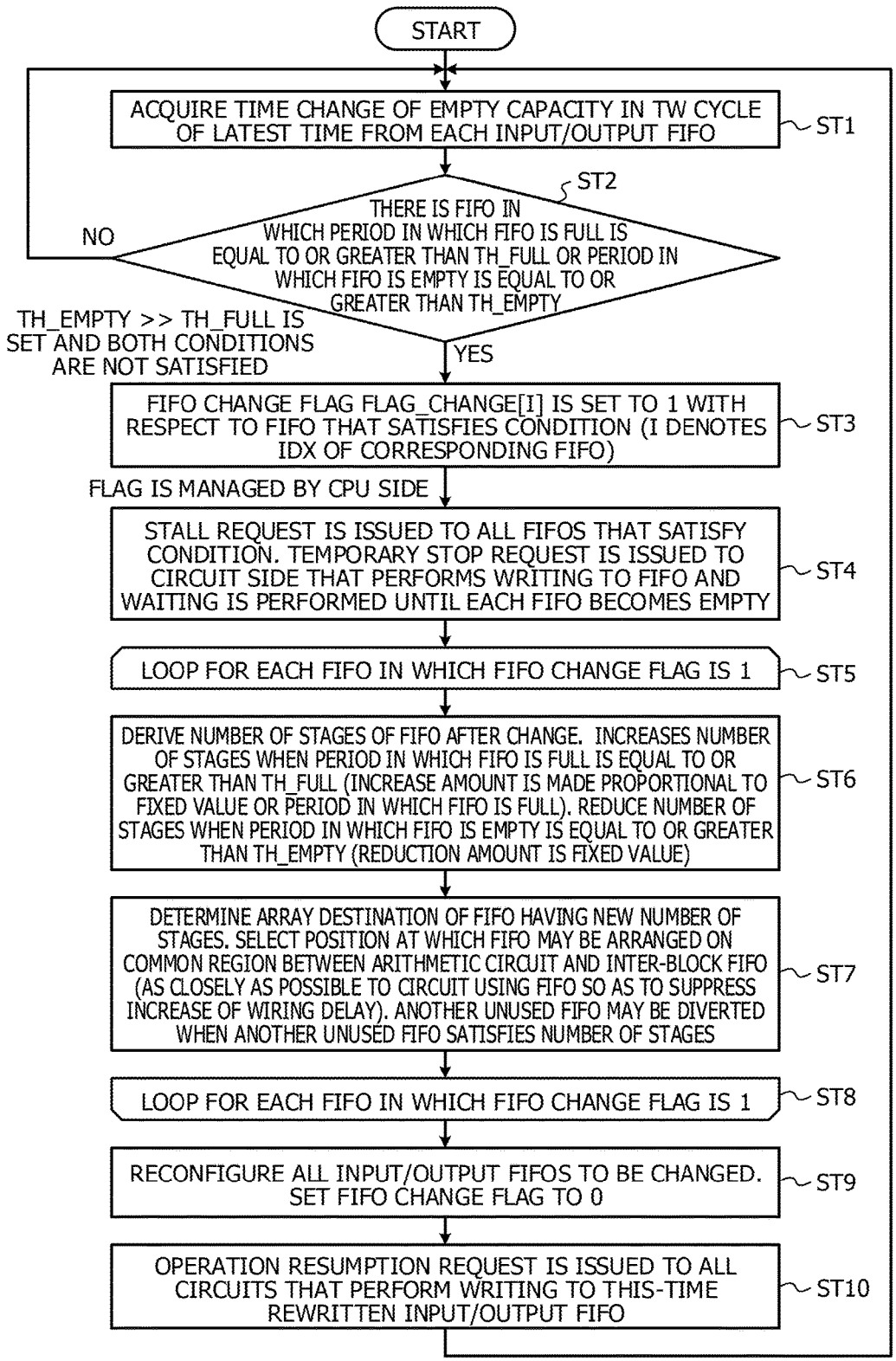
FIG. 10 is a flowchart for describing an example of processing in the information processing apparatus according to the embodiment.

FIG. 10 is a flowchart for describing an example of processing in the information processing apparatus according to the embodiment. Herein, the capacity (the number of empty stages, size) of the FIFO is observed by, for example, the capacity monitoring unit 20 at predetermined time intervals and the control mechanism unit 30 reconfigures the number of stages of the FIFO which is determined as inappropriate based on the time change of the FIFO capacity.

As illustrated in FIG. 10, when an example of the processing in the information processing apparatus according to the embodiment starts, in step ST1, the time change of the empty capacity in cycle of a latest time interval (Tw cycle) is acquired from each input/output FIFO and then, the process proceeds to step ST2. In step ST2, it is determined whether there is FIFO in which a period in which the FIFO is full is equal to or greater than a predetermined full threshold value (Th-full) or a period in which the FIFO is empty is equal to or greater than a predetermined empty threshold value (Th-empty). Herein, Th-empty is set to be sufficiently larger than Th-full (Th-empty>>Th-full) so that both conditions are not satisfied.

In step ST2, when it is determined that there is FIFO in which the period in which the FIFO is full is equal to or greater than the Th-full or the period in which the FIFO is empty is equal to or greater than Th-empty, the process proceeds to step ST3 to set an FIFO change flag with respect to the FIFO that satisfies the condition. For example, in step ST3, the FIFO change flag flag-change [i]=1 is set for the FIFO satisfying the condition and the process proceeds to step ST4. Here, i denotes an index number (idx) of the corresponding FIFO and the FIFO change flag "1" indicates that the corresponding FIFO is the FIFO to be changed.

In step ST4, a stop (stall) request is issued to all FIFOs that satisfy the condition. For example, as described with reference to FIG. 7D, in order to empty the FIFO to be changed (the condition is satisfied), a stop (temporary stop) request is issued to the block (circuit) on the write side. Then, waiting is performed until the FIFO to be changed becomes empty and loop processing for each FIFO of steps ST5 to ST8 is performed.

Next, the loop processing of steps ST5 to ST8 will be described. First, in step ST5, loop processing related to each FIFO whose FIFO change flag is "1" starts and the process proceeds to step ST6. Herein, the loop processing of steps ST5 to ST8 may be performed in parallel in respective FIFOs of different arrangements, for example, respective FIFOs arranged in the FF, the SRAM, and the DRAM.

In step ST6, the number of stages of the FIFO after changing of the FIFO that satisfies the condition described above is derived and the process proceeds to step ST7. For example, in step ST6, the number of stages of the FIFO is increased when the period in which the FIFO is full is equal to or greater than the Th-full and the number of stages of the FIFO is decreased when the FIFO is empty is equal to or greater than the Th-empty. Herein, an increase amount of the number of stages of the FIFO may be made proportional to a fixed value or the period in which the FIFO is full and a reduction amount of the number of stages of the FIFO may be set to the fixed value desirably.

In step ST7, the array destination of the FIFOs with the new number of stages is determined and the process proceeds to step ST8. For example, in step ST7, a position at which the FIFO may be arranged on the common region 10 of the arithmetic circuit and the inter-block FIFO is selected. Herein, for example, the FIFO may be arranged as closely as possible to the circuit using the FIFO so as to suppress the increase of the wiring delay desirably. Further, for example, when another unused FIFO (already empty FIFO) satisfies the number of stages, it is also possible to divert the unused FIFO. In addition, in step ST8, loop processing related to each FIFO whose FIFO change flag is "1" ends and the process proceeds to step ST9.

In step ST9, all input/output FIFOs to be changed are reconfigured and the FIFO change flag is set to "0, and the process proceeds to step ST10. Further, the FIFO change flag "0" indicates that the corresponding FIFO is not the FIFO to be changed. In step ST10, an operation resumption request is issued with respect to all circuits on the write side for the input/output FIFO which has been rewritten (reconfigured) this time and the process returns to step ST1 to repeat the processing similar to the processing described above. In the above description, an example in which all the FIFOs satisfying the condition for changing the number of stages of the FIFO are stopped and reconfigured has been described, but for example, after stopping and reconfiguring predetermined FIFO, it is possible to perform processing of the next FIFO.

Figure 11:
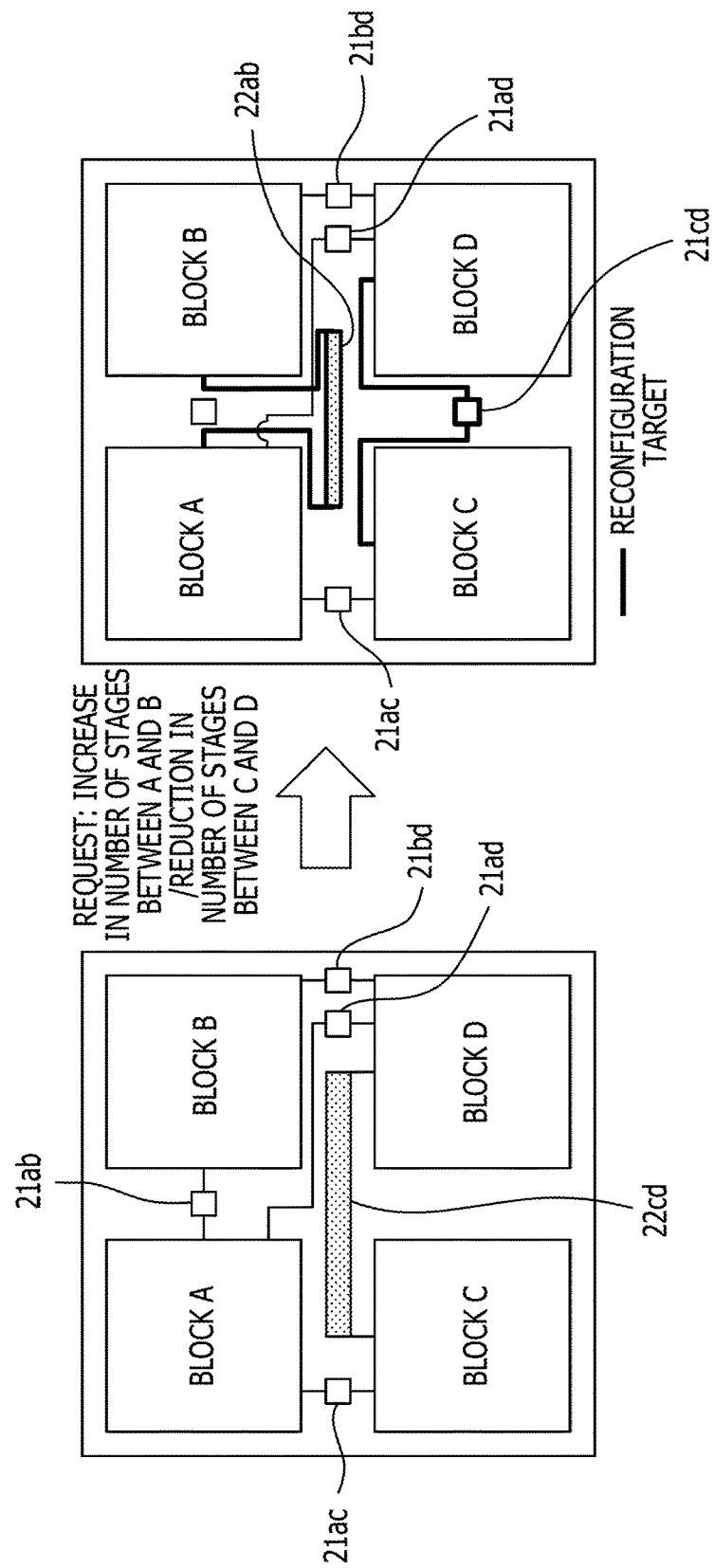
FIG. 11 is a diagram for describing application of an information processing method according to the embodiment.

FIG. 11 is a diagram for describing application of an information processing method according to the embodiment. (1) of FIG. 11 corresponds to a case of adding the FIFO (21bd) to FIG. 7A (FIG. 7B) and (2) of FIG. 11 corresponds to a case of adding the FIFO (21bd) to FIG. 7E (FIG. 7F).

As is apparent from the comparison between (1) of FIG. 11 and (2) of FIG. 11, by applying the information processing method according to the embodiment, for example, the FIFO (21ab) of the FF is reconfigured and changed to the FIFO (22ab) of the SRAM between the blocks A and B in which the increase in the number of stages of the FIFO is requested. Further, for example, between the blocks C and D in which the reduction in the number of stages of the FIFO is requested, the FIFO (22cd) of the SRAM is reconfigured and changed to the FIFO (21cd) of the FF. For example, an appropriate number of stages is obtained according to the usage situation of each inter-block FIFO and the number of stages of the FIFO is dynamically reconfigured and changed.

Herein, the reconfiguration of the FIFO parts (21ab, 22cd, 22ab, and 21cd) is a reconfiguration of only the common region 10 set on the FPGA and the blocks A to D and other FIFOs (21ac, 21ad, and 21bd) are not changed. As described above, by applying the information processing method according to the embodiment, it is possible to dynamically change the FIFO between the blocks while suppressing an increase in the time for the reconfiguration processing and circuit scale.

All examples and conditional language recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority and inferiority of the disclosure. Although the embodiment(s) of the present disclosure has (have) been described in detail, it should be understood that the various changes, substitutions, and alterations could be made hereto without departing from the spirit and scope of the disclosure.

What is claimed is:

1. An information processing apparatus comprising:
a processor for an arithmetic processing; and
a reconfiguration circuit for the arithmetic processing;
the reconfiguration circuit includes:
  a plurality of blocks,
  a plurality of inter-block FIFOs each of which couples at least two of the plurality of blocks with each other, and
  a common region arranged in the plurality of blocks in order to accommodate the plurality of inter-block FIFOs,
the processor is configured to:
  periodically monitor an empty capacity of each of the plurality of inter-block FIFOs included in the reconfiguration circuit;
  collect information on the empty capacity of each of the plurality of inter-block FIFOs provided in the common region;
  specify a target inter-block FIFO based on the collected information; and
  selectively change number of stages of the target inter-block FIFO disposed in the common region such that a reconfiguration of the plurality of inter-block FIFOs is performed only in the common region, and
the number of stages of the target inter-block FIFO is selectively changed such that:
  the number of stages of the target inter-block FIFO is controlled to be reduced when the empty capacity of the target inter-block FIFO is equal to or greater than a predetermined threshold value, and
  the number of stages of the target inter-block FIFO is controlled to increase when the empty capacity of the target inter-block FIFO is smaller than the predetermined threshold value, and
  when the number of stages of the target inter-block FIFO by an SRAM is reduced, the target inter-block FIFO by the SRAM is changed to the target inter-block FIFO by a flip-flop, and when the number of stages of the target inter-block FIFO by the flip-flop increases, the inter-block FIFO by the flip-flop is changed to the inter-block FIFO by the SRAM, and the flip-flop and the SRAM are arranged in the common region.

2. The information processing apparatus according to claim 1, wherein the processor controls the number of stages of the target inter-block FIFO after the target inter-block FIFO is empty before changing the number of stages of the target inter-block FIFO.

3. The information processing apparatus according to claim 1, wherein when the number of stages of the target inter-block FIFO is satisfied and there is an inter-block FIFO which is already empty, the processor controls the inter-block FIFO to be diverted.

4. The information processing apparatus according to claim 2, wherein when controlling the number of stages of the target inter-block FIFO is completed, the processor controls to start writing with respect to the target inter-block FIFO which is empty.

5. The information processing apparatus according to claim 1, wherein one of the flip-flop, the SRAM, and a DRAM is selected as each of the plurality of inter-block FIFOs based on a capacity of each of the plurality of inter-block FIFOs.

6. The information processing apparatus according to claim 5, wherein the flip-flop and the SRAM are arranged in the common region.

7. An information processing method comprising:
providing a common region in a reconfiguration circuit in order to accommodate a plurality of inter-block FIFOs;
periodically monitoring an empty capacity of each of the plurality of inter-block FIFOs that couples at least two of a plurality of blocks included in the reconfiguration circuit with each other;
collecting information on the empty capacity of each of the plurality of inter-block FIFOs provided in the common region;
specifying a target inter-block FIFO based on the information collected at the collecting; and
selectively changing number of stages of the target inter-block FIFO disposed in the common region in order to perform a reconfiguration of the plurality of inter-block FIFOs only in the common region, in the selectively changing number of stages of the target inter-block FIFO, the number of stages of the target inter-block FIFO is controlled to be reduced when the empty capacity of the target inter-block FIFO is equal to or greater than a predetermined threshold value, and the number of stages of the target inter-block FIFO is controlled to increase when the empty capacity of the target inter-block FIFO is smaller than the predetermined threshold value, and when the number of stages of the target inter-block FIFO by an SRAM is reduced, the target inter-block FIFO by the SRAM is changed to the target inter-block FIFO by a flip-flop, and when the number of stages of the target inter-block FIFO by the flip-flop increases, the inter-block FIFO by the flip-flop is changed to the inter-block FIFO by the SRAM, and the flip-flop and the SRAM are arranged in the common region.

8. A non-transitory computer-readable storage medium storing an information processing program that causes a computer to perform an operation process, the process comprising:

providing a common region in a reconfiguration circuit in order to accommodate a plurality of inter-block FIFOs;

periodically monitoring an empty capacity of each of the plurality of inter-block FIFOs that couples at least two of a plurality of blocks included in the reconfiguration circuit with each other;

collecting information on the empty capacity of each of the plurality of inter-block FIFOs provided in the common region;

specifying a target inter-block FIFO based on the information collected at the collecting; and selectively changing number of stages of the target inter-block FIFO disposed in the common region in order to perform a reconfiguration of the target inter-block FIFOs only in the common region, in the selectively changing number of stages of the target inter-block FIFO, the number of stages of the target inter-block FIFO is controlled to be reduced when the empty capacity of the target inter-block FIFO is equal to or greater than a predetermined threshold value, and the number of stages of the target inter-block FIFO is controlled to increase when the empty capacity of the target inter-block FIFO is smaller than the predetermined threshold value, and when the number of stages of the target inter-block FIFO by an SRAM is reduced, the target inter-block FIFO by the SRAM is changed to the target inter-block FIFO by a flip-flop, and when the number of stages of the target inter-block FIFO by the flip-flop increases, the inter-block FIFO by the flip-flop is changed to the inter-block FIFO by the SRAM, and the flip-flop and the SRAM are arranged in the common region.

* * * * *